United States Patent [19]
Ogura et al.

[11] Patent Number: 4,868,135
[45] Date of Patent: Sep. 19, 1989

[54] METHOD FOR MANUFACTURING A BI-CMOS DEVICE

[75] Inventors: Seiki Ogura, Hopewell Junction; Nivo Rovedo, Lagrangeville, both of N.Y.

[73] Assignee: International Business Machines Corporation, Armonk, N.Y.

[21] Appl. No.: 287,945

[22] Filed: Dec. 21, 1988

[51] Int. Cl.$^4$ .......................................... H01L 21/265
[52] U.S. Cl. ........................................ 437/31; 437/34; 437/56; 437/70; 437/41; 437/11; 437/45; 437/911; 357/43; 357/91
[58] Field of Search ................. 437/31, 26, 34, 33, 437/56, 57, 69, 70, 41

[56] References Cited

U.S. PATENT DOCUMENTS

| | | | |
|---|---|---|---|
| 4,403,395 | 9/1983 | Curran | 437/34 |
| 4,553,315 | 11/1985 | McCarty | 437/56 |
| 4,696,092 | 9/1987 | Doering et al. | 437/34 |
| 4,778,774 | 10/1988 | Blossfeld | 437/34 |
| 4,784,966 | 11/1988 | Chen | 437/31 |
| 4,818,719 | 4/1989 | Yeh et al. | 437/42 |

Primary Examiner—Brian E. Hearn
Assistant Examiner—Beverly A. Pawlikowski
Attorney, Agent, or Firm—Alexander Tognino

[57] ABSTRACT

A method for fabricating a Bi-CMOS device is disclosed herein, which device can include both vertical PNP and NPN components. The process steps include forming the reach-through N+ subcollector to the bipolar device without extra processing steps; combining into one mask the threshold adjust/well implants with self-aligned isolation leakage protection implants by using a self-aligned, removable oxide mask prior to field isolation; using a resist etch-back scheme to protect against emitter-to-base punch-through while self-aligning the pedestal and base; and also providing for the removal of the gate oxide at the emitter while maintaining it at the FET, without extra masks.

The device incorporates similar structural featues between the bi-polar and FET devices. The NPN and pFET can share the same well and a P+ diffusion (the p+ extrinsic base is the same as the p+ source). Also, the pnp and nFET can share the same well and an n+ diffusion.

21 Claims, 5 Drawing Sheets

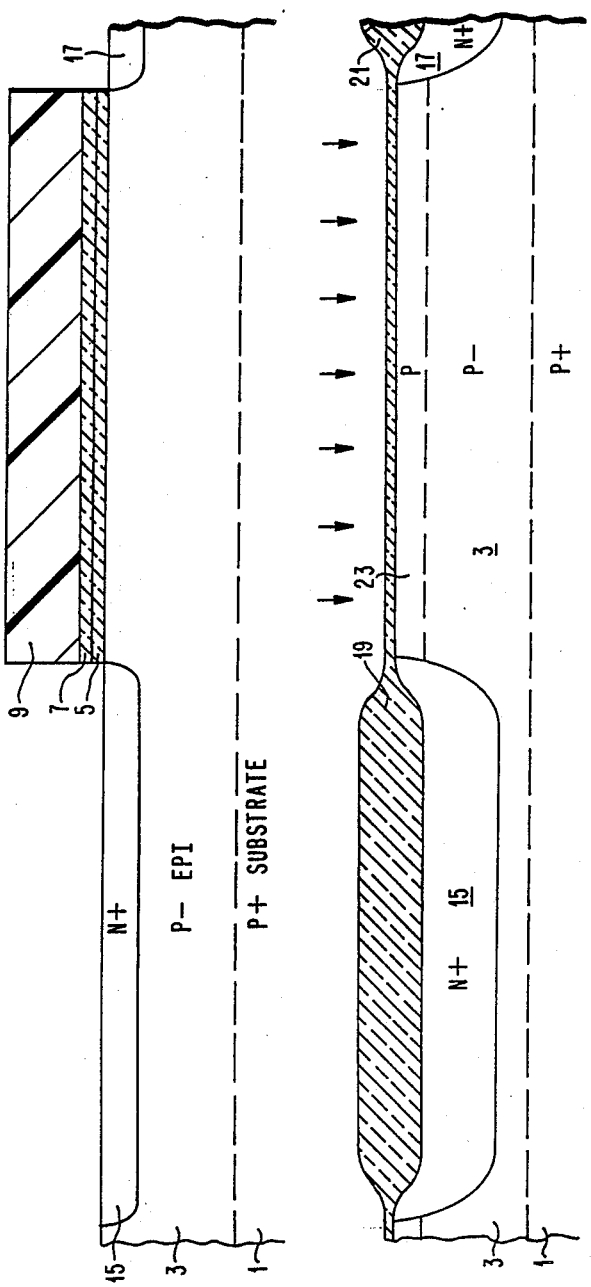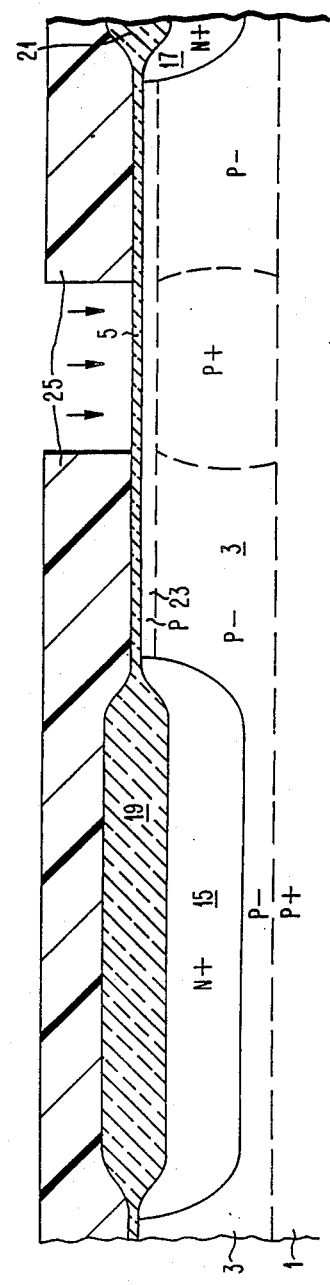

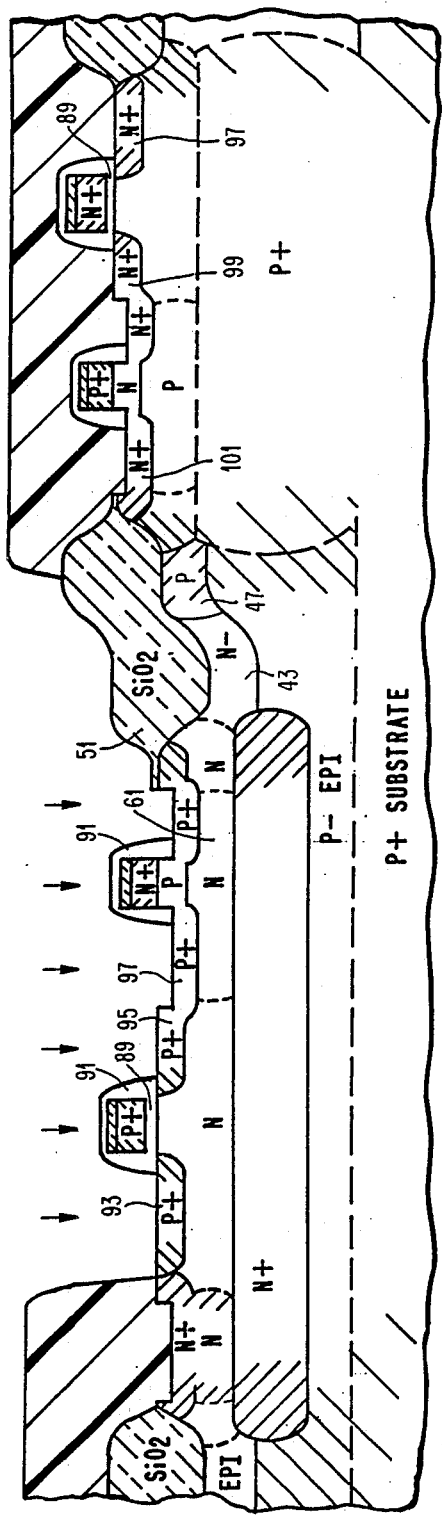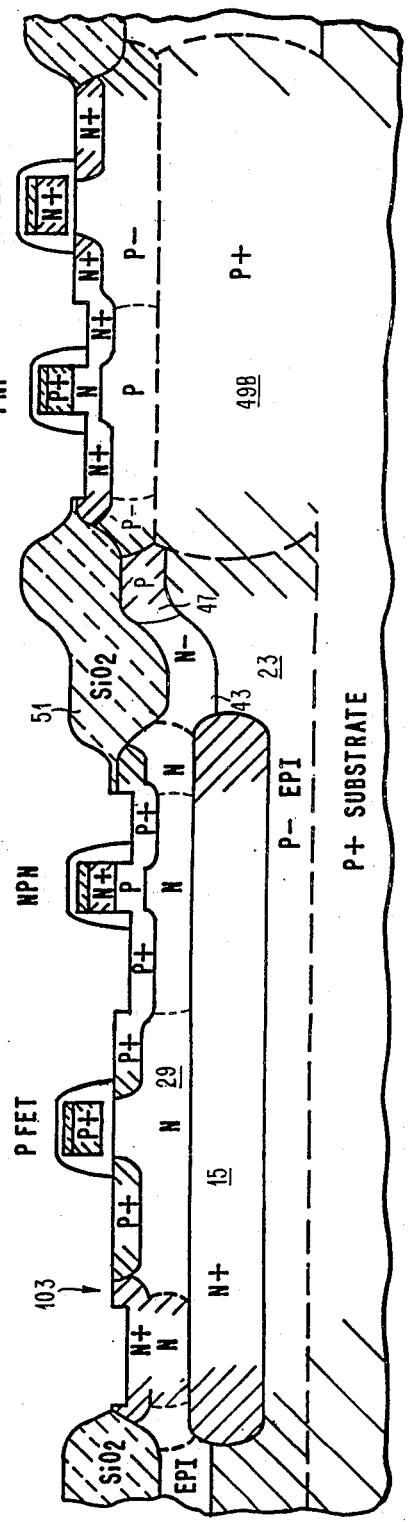
FIG. 10
FIG. 11

METHOD FOR MANUFACTURING A BI-CMOS DEVICE

BACKGROUND OF THE INVENTION

1. Field of the Invention This invention relates to a method for manufacturing a Bi-CMOS Semiconductor Device and more particularly to a fabrication technique for producing a Bi-CMOS device with vertical bipolar NPN and PNP components.

2. Related Art

Bi-CMOS technology (bipolar and CMOS transistors on a single semiconductor substrate) has become an increasingly attractive device technology because it can provide high performance (better than CMOS alone) without high power consumption (much lower than bipolar alone). One the recognized drawbacks in fabricating such Bi-CMOS devices is the increased processing required to produce such high performance CMOS and bioplar components on the same chip. Heretofore, the skill in the art has been to combine the separate processes steps as known for each technology into a combined processing sequence. This has resulted in overly complicated processing plans, which plans are undesirable as they contain excessive processing steps and are time-consuming and costly. Therefore, there has been an ever increasing need for a Bi-CMOS device which can be fabricated with a greater integration of the bipolar and CMOS process steps.

In order to reduce the processing complexity, the invention herein incorporates a structure which was specially developed to be compatible with the bipolar and the CMOS device. With this structure, processing steps can now be shared to simplify the Bi-CMOS fabrication.

As a representative example, a significant reduction in the processing complexity can be achieved by incorporating the following fabrication steps:

(1) forming the reach-through to the subcollector by using steps having other functions;

(2) combining into one mask the threshold adjust/well implants with self-aligned isolation by using a self-aligned removable oxide mask prior to field isolation;

(3) using a resist etch-back scheme to protect against emitter-base punch-through while self-aligning the pedestal and base; and (4) providing for the removal of the gate oxide at the emitter while maintaining it with the FET without the necessity of using extra mask steps.

In this field some of these process steps have been performed on an individual basis. For example, in U.S. Pat. No. 4,721,686, a reduction in masking steps is taught by performing a boron implant on the surface of an epitaxial layer without masking, and arsenic implant in predetermined locations on the epitaxial layer surface by means of an appropriate mask. to the integrated reduction in masking steps of the present Bi-CMOS fabrication.

In addition, there are other processing techniques which are known in this field for the production of Bi-COMS devices. U.S. Pat. No. 4,484,388 discloses a method for forming a Bi-CMOS structure whereas a different Bi-CMOS device is produced by an unrelated process whcih includes steps to form an emitter self-aligned to the base and form the gate oxide over the emitter.

Another example of related teachings in the fabrication of Bi-CMOS devices is U.S. Pat. No. 4,737,472. This patent discloses a process for the fabrication of Bi-CMOS devices wherein the bipolar device is a self-aligned transistor using polysilicon contacts. This device requires a more complicated process for fabrication and also has a different structure.

A still further teaching in the art of self-aligned polysilicon transistors is seen in the article "Increased Current Gain and Suppression of Peripheral Base Current is Silicided Self-Aligned Narrow Width Polysilicon-Emitter Transistors of an Advanced Bi-CMOS Technology," IEEE Electron Device Letters, Vol. 9, May 1988. Therein the current gain of Bi-CMOS devices is taught to be improved by the introduction of a lightly doped extrinsic base region (LDEB) below the oxide sidewall spacer. However, the incorporation of (LDEB) region is a single process modification without teaching integration of the fabrication of the Bi-CMOS device.

It is, therefore, an object of the present invention to develop a process for fabricating a Bi-CMOS device which process includes common steps for integration of the fabrication of the bipolar and CMOS device.

It is a further object of the present invention to develop a process which is simpler and more efficient in the use of the processing steps in the fabrication of the Bi-CMOS device.

It is a still further object of the present invention to develop a process for fabricating a Bi-CMOS device which includes both a vertical NPN and vertical PNP components.

SUMMARY OF THE INVENTION

A method for fabricating a BI-CMOS device using fewer processing steps combined with the incorporation of a vertical PNP and NPN bipolar device is disclosed. A bipolar structure for the device is configured which is closer to and more compatible with that of the FET.

Briefly, some of the generalized processing steps include: forming the reach-through N+subcollector to the bipolar device without extra processing steps; combining into one mask the threshold adjust/well implants with self-aligned isolation leakage protection implants by using a self-aligned, removable oxide mask prior to field isolation; using a resist etch-back scheme to protect against emitter to base punch-through while self-aligning the pedestal and base; and also providing for the removal of the gate oxide at the emitter while maintaining it at the FET, without extra masks.

In addition to the reduced processing complexity available by the incorporation of the above steps, the combination of the bipolar devices with the CMOS device can now be expanded. As an option, a vertical PNP can now be added to the device in addition to the CMOS component and vertical NPN. This permits additional flexibility in circuit design, as for example, where the vertical PNP's subcollector is tied to the substrate to create a particular circuit. These special circuits and structures have the advantage of offering reduced device count for similar performance with less processing complexity.

Moreover, with the subject invention the device structure is such that the bipolar and CMOS components can share similar structural features. For example, the NPN and pFET share the same well and share a diffusion (the p+ extrinsic base is the same as the p+ source). Also, the pnp and nFET share the same well and an n+ diffusion. This permits the merging of components which results in reduced component count and increased density. Also, if the circuit design is an emitter follower circuit, the subcollectors are tied to a constant voltage, which means that the collector capacitance is not critical since there is no charging and discharging. Thus, trench isolation (often used to reduce collector area by cutting it off and, therefore, collector capacitance) is not necessary. This makes the processing sequence simpler as recessed oxide isolation can be used.

Moreover, the availability of these device types permits fabrication of circuits in which the voltage to which the FET's are exposed is reduced in the circuit, so the FET device structure can be simplified despite the submicron channel lengths. In addition, no lightly doped drain (LDD) region is required. A graded junction for the nFET can be provided by using phosphorous as well as arsenic in the N+ source/drain. The punch-through protection normally provided using a p type implant (DI-LDD) is derived from the well design, in which the dopant concentration is increased where punch-through may occur at the junction.

In another embodiment, the vertical PNP is incorporated into the Bi-CMOS device without limitation to a particular circuit. In this case, trench isolation will be used to provide lateral isolation. The isolation to the substrate can then be accomplished either by using an oxygen implant to form a buried insulation layer or by starting with an n− (on p+) epi and ensuring that the p+ subcollector does not extend through the n- epi and touch the p+ substrate.

The foregoing and other objects, features and advantages of the invention will be apparent from the following more particular description of the invention as illustrated in the accompanying drawings.

BRIEF DESCRIPTION OF THE DRAWINGS

FIGS. 1-11 are cross-sectional views in the fabrication sequence of the subject Bi-CMOS device.

DETAILED DESCRIPTION ON THE PREFERRED EMBODIMENT

Figure 4:
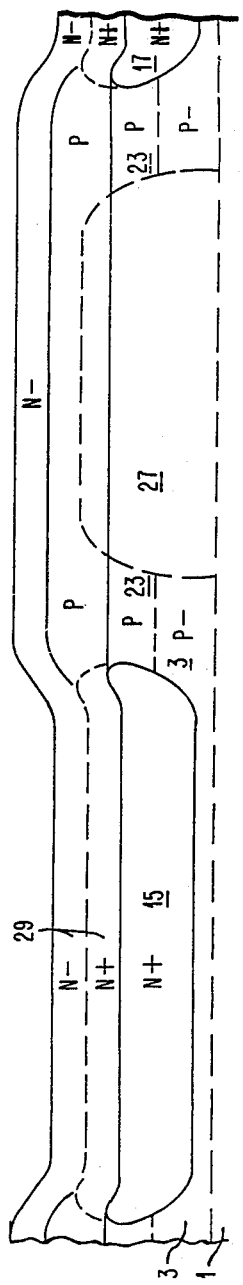

Referring now to FIG. 1, onto a P+ substrate 1 is deposited a P− epi layer 3. The starting wafer is a P− epi on a P+ substrate except if the PNP is to be isolated by N− epi on P+ substrate. The epi layer thickness is chosen so that, at the process end, the n+ subcollector junction depth is about 1 μm more shallow than the P−/P+ transition to avoid high capacitance/low voltage breakdown. This yields an epi layer thickness on the order of 3–6 μm.

Onto said epi layer 3 is grown, approximately 250 Å of oxide 5 followed by a deposition of approximately 1000 Å of nitride 7. A photoresist mask layer 9 is then deposited over the nitride layer 7, wherein said photoresist layer 9 is exposed and developed in the selective areas 11 and 13. The nitride 7 and oxide 5 layers are now removed by RIE etching the unmasked areas. Subcollector areas 15 and 17, are formed by an arsenic (As) or antimony (Sb) implant in the unmasked areas at a dose rate of $10^{15} - 10^{16}$ cm$^{-2}$.

From FIG. 2, it can be seen that the subcollector areas 15 and 17 are driven-in and oxidized to thicknesses 19 and 21 of approximately 2000 Å–5000 Å to lower the resistance and remove any implant or RIE damage. The areas covered by nitride mask 7 will not be oxidized and the resulting difference in height will provide a feature by which to align subsequent masks. The nitride layer 7 is now stripped using, for example, H$_3$PO$_4$. A boron implant ($120^{13} - 10^{14}$cm$^{-2}$), lighter than the N+ dose of the subcollector, is then blanket implanted into epi layer to form P layer 23. This P layer 23 helps block the lateral spread of the N+ subcollector during the subsequent epi growth (autodoping).

Referring now t FIG. 3, a photolithographic mask 25 is now deposited, exposed and developed to open a mask for the P+ subcollector reach-through 27 implant. The P+ ubcollector 27 is formed by implanting boron more heavily and deeply than the previous boron implant. The implant has a dose rate of approximately $10^{--} - 10^{15}$cm$^{-2}$ at 300–700 KEV range. This subcollector 27 also links the surface to the P+ substrate through a lower resistance path than the Pepi layer 3. The p+ subcollector and n+ subcollectors are prevented from coming into contact to avoid defect generation. The P+ subcollector implant 27 also helps link the PNP collector to the substrate in the configuration wherein the subcollector is not isolated. The photoresist is stripped away and damage done by the ion implant is then removed by annealing on the order of 950° C. for 30 minutes.

Both the thick and thin oxide layers 19, 21 and 5 are now removed from the surface of FIG. 3 and an epi layer 29 is grown approximately 0.9–1.5 μm thick. The epi layer 29 can be doped to be either a P- or N- layer with approximately 1El0$^{16}$ doping. With n- doping, the epi layer 29 will be as shown in FIG. 4. As will be recognized by those skilled in the art, the implanted N+ and P+ profiles will diffuse into the new epi layer 29 as shown.

Figure 5A:
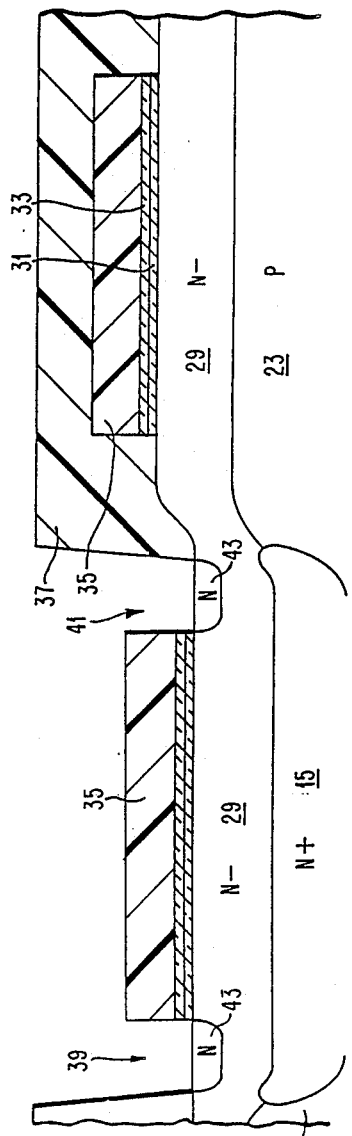

Next, surface isolation is performed by using a type of a recessed-oxide isolation process. Referring now to FIG. 5A, a pad oxide 31 of 250 Å is grown on the surface of the N− epi layer 29. A nitride layer 33 approximately 1000 Å thick is deposited on the pad oxide 31 and a 5000 Å layer 35 of oxide is deposited by CVD over the nitride. This stack is then patterned and selectively removed by photolithography to form the isolation pattern desired.

Figure 5B:
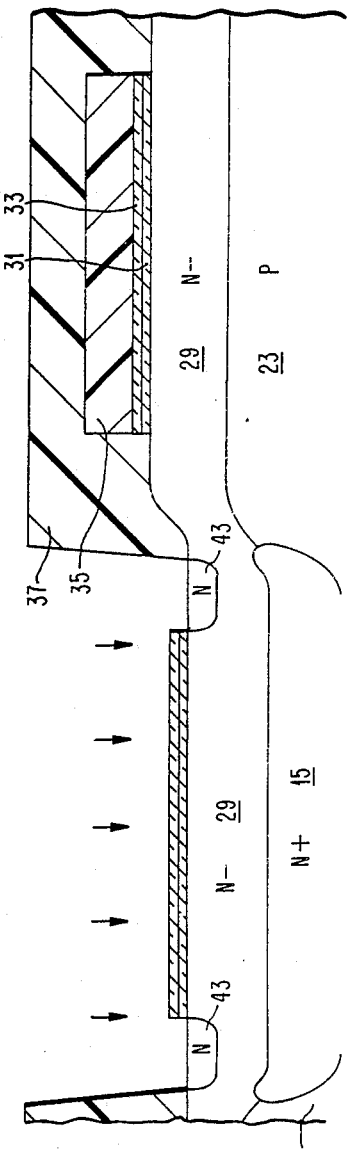

Next, an "n well" mask 37 (where NPN and PFET are located) is used to open those areas in the isolation stack where the PFET and NPN will be made. A guard ring implant ($10^{12} - 10^{13}$ dose) is made, with the selection of implant energies so that only the edges of the device region 39 and 41 are doped. This guard ring 43 prevents leakage by enhancing the dopant concentration where the subsequent source/drain diffusions will butt the isolation oxide. With the "n well" resist 37 still in place, the top CVD oxide 35 is removed (See FIG. 5B) and the threshold adjust implant/punch-through protection implants are performed through the nitride 33 and pad oxide 31. In this process, a separate masking step to prevent the guard ring ion implant from influencing the threshold has been eliminated; in addition, the guard ring is self-aligned to the device area edge. The n-well resist 37 is then removed.

Figure 6:
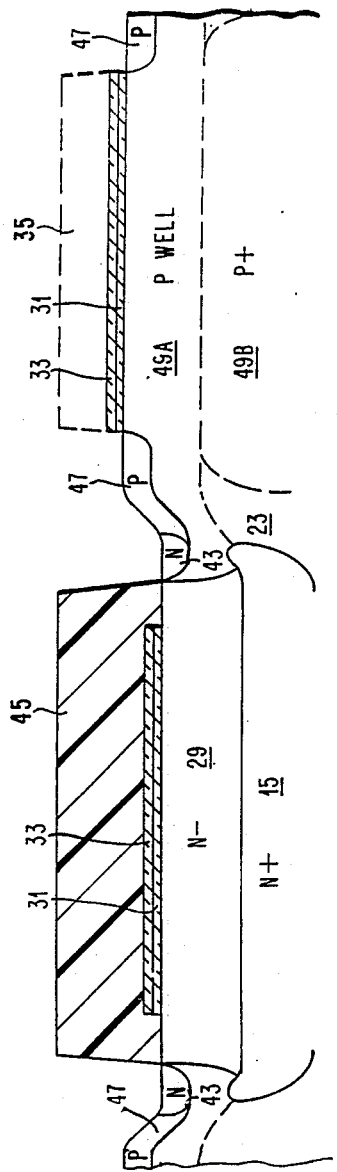

FIG. 6 shows the forming of the P well for the NFET and PNP. Resist 45 covers the n-well regions and a p type channel stop 47 is implanted into the field not doped by the n type guard ring but not into the nFET and PNP device regions. The purpose of the p type channel stop 47 is to prevent inversion of the surface due to a charge in the oxide or from the gate overlap of the thick oxide. The CVD oxide 35 on the p regions to be implanted is then selectively stripped away while leaving the P well resist mask 45 in place. Now, the P well/$V_T$ adjust implants are performed and the n- epi is locally converted into P type 49A by these implants. The doping is such that during the field oxidation, the p well connects to the p type epi under the n-epi. The surface concentration is adjusted to attain the desired $V_T$ of the n FET.

Figure 7A:
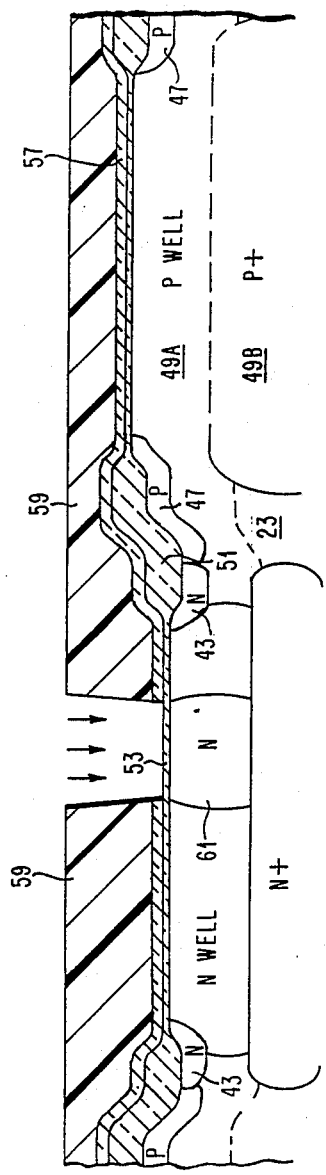

Next, as seen in FIG. 7A, the field 51 is oxidized (5000 Å–6000 Å) the nitride 33 oxide 31 pad stack is removed and a gate oxide 53 (100 Å–150 Å) is grown. The wafer is covered by a blanket deposition of a relatively thin (500 Å–600 Å) layer 57 of LPCVD polysilicon. This layer acts to protect the gate oxide for the FET's while the oxide is removed for the formation of the bipolar transistors' emitters.

Figure 7B:
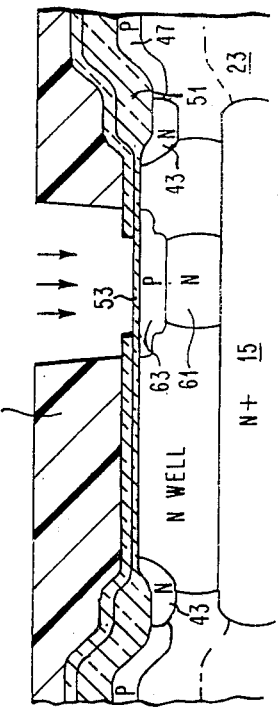

A resist mask 59 is used for each type of bipolar device to define the area which will get the intrinsic base implant and the pedestal implant. First, the polysilicon 57 is etched selectively down to the gate oxide 53 (by RIE, e.g.). Then, one type of pedestal 61 is implanted (FIG. 7A). Next, in order to avoid the emitter-base punch-through problem which might have arisen if the emitter edge were self-aligned to base edge, the resist 59 is controllably etched-back; in this way the subsequent intrinsic base implant goes under the polysilicon layer 57 edge regions (and, therefore, past the emitter edge), to protect against punch-through as seen in FIG. 7B.

The etch back can either be done in a resist strip tool or a more directional RIE tool run at relatively high pressure. The process needs some degree of lateral etch so that the edge of the resist pulls back laterally, allowing the intrinsic base implant to go under the polysilicon. This yields a higher base dopant concentration at the emitter edge. After the intrinsic base implant 63, the resist 59 is stripped, and the analogous process (not shown) occurs on the opposite type of bipolar, with a mask to define the intrinsic base and pedestal implants. Again, the gate oxide acts as a screen oxide in both cases.

Figure 8:
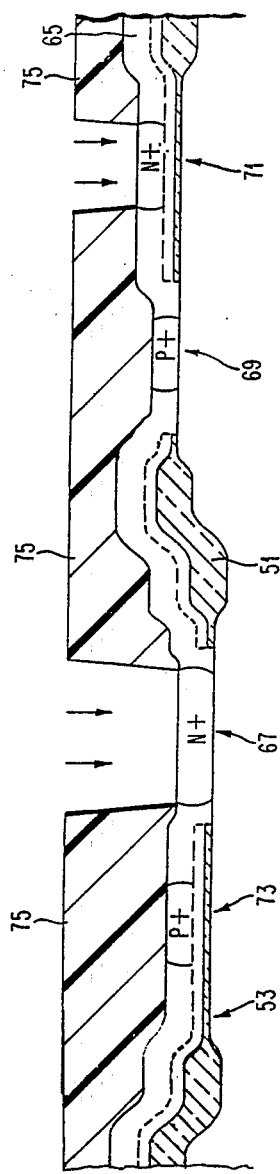

Now the polysilicon emitter and FET gate electrodes can be formed. Since for the bipolar, the polysilicon must be in contact with single crystal silicon, the gate oxide 53 must be removed; but it must be kept for the FET's. As shown in FIG. 8, this is resolved without a mask by using a dilute HF wet etch just prior to a second, thicker polysilicon deposition 65 (1500 Å–3000 Å) to clean the surface. At the FET areas, however, the initial polysilicon 57 covers the gates and prevents the etchant from damaging them. The etch clears off the surface of the polysilicon of any native oxide, so the next layer makes good contact to the previous polysilicon. Alternate masking 75 is now used to dope the polysilicon as appropriate for emitter gates 67 and 71 of npn/nFET (n type) and gates 69 and 73 of pnp/pFET (p type).

Figure 9:
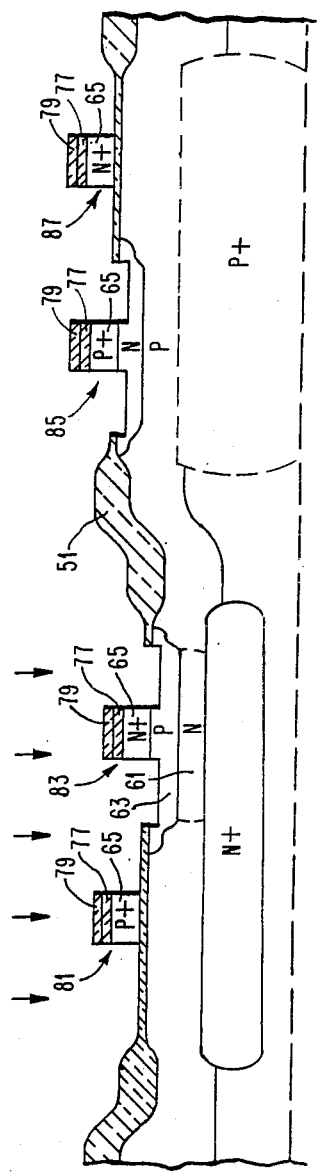

In FIG. 9 to achieve a low resistivity, a silicide 77 (e.g., WSi2 or TiSi2) is formed on the polysilicon 65 and a CVD oxide or intrinsic polysilicon 79 is used to cap the silicide 77. The gate/emitter stacks 81, 83, 85, and 87 are then patterned by directional etching.

However, as the gate polysilicon is thicker than the emitter polysilicon (by the initial protective polysilicon 57) the single crystal silicon around the emitter will be etched. This will increase the distance between the emitter and the extrinsic base, so that the reverse breakdown voltage of the emitter-base junction will not be unacceptably low.

Some combination of oxidation and CVD oxide deposition (along with RIE) is used to form a spacer 91 approximately (300 Å–1000 Å) at the edges of the emitter/gate. This oxide 91 acts as a spacer to offset the source/drain and extrinsic base implants from the edges of the gate/emitter. In the case of FET's, it prevents damage by the implants from impinging on the gate edge; for the bipolar, it moves the extrinsic base implant away from the emitter edge so the two high concentration regions do not touch and cause unacceptably low reverse breakdown. Two masks can now be used to selectively: 1) implant the p+ source/drain 93/95 and extrinsic base 97 of the pnp/pFET; and 2) implant the n+ source/drain 97/99 and extrinsic base 101 of the nFET/npn. If the spacing for the p+ to gate/emitter edge is to be different from the n+ to gate/emitter edge, one type implant can be done and then a second spacer formation process can be undertaken by CVD oxide deposition and RIE; this increases the source/drain (or extrinsic base) to gate/emitter edge spacing. Now the second source/drain implant can be done.

In FIG. 11, the oxide and silicide on top of the gate/emitter polysilicon prevents the source/drain dopant from counter doping the polysilicon. A drive-in will finish the processing. The reach-through 103 to the N+ ubcollector is made the same way as the npn extrinsic base 97 adjacent to the emitter in that the reach-through gets a N+ implant using the source/drain mask. This N+ implant (instead of a P+ implant) counterdopes the base implant. Analogously, the reach-through to the P+ ubcollector is made by using the non-emitter pnp base region doped with the p+ source/drain implant (not shown in FIG. 11). No extra processing is needed to form the reach-through.

While the invention has been particularly shown and described with reference to the preferred embodiments thereof, it will be understood by those skilled in the art that various changes in form and details may be made therein without departing from the spirit and scope of this invention:

We claim:

1. In a process for the simultaneous production of vertical NPN and PNP bipolar transistors and complementary field effect transistors on a common P-doped epitaxial layer wherein said substrate has an epi layer grown on its surface and said substrate has formed at selected locations N+ subcollector areas which subcollectors are oxidized to a different height for alignment of subsequent masks and said substrate has also formed therein P+ subcollectors at selected locations for providing a low resistance path to the substrate, the improvement to the process comprising the steps of:

(a) growing/depositing a thin oxide and nitride layer on the surface of said wafer and depositing an oxide layer onto said nitride layer, (b) patterning said oxide/nitride/oxide layer to locate the surface isolation areas, (c) masking said n well regions, (d) implanting n type dopant at the exposed regions to form a device guard ring, (e) removing the exposed oxide layer and implanting n type dopant to adjust the threshold voltage, (f) removing the n well resist mask and repeating steps c-e for the P well for the n/FET and PNP substituting P type dopant for the n-type dopant, and then removing the P well resist, (g) oxidizing the field, removing the nitride/pad oxide layer and growing a gate oxide, (h) blanket depositing a layer of LPCVD polysilicon, (i) masking said polysilicon with resist and selectively etching said polysilicon down to the gate oxide in the bipolar emitter region and collector reach-through region, (j) implanting an n-type pedestal collector in said opened locations, (k) etching back the photoresist, (l) implanting P type dopant into the bipolar base well, (m) removing the photoresist mask, (n) repeating steps g-m for the opposite type of bipolar device substituting P type dopant for the n type dopant, (o) removing the gate oxide layer, (p) depositing a second layer of polysilicon on the surface, (q) doping the polysilicon, (r) patterning the polysilicon to form the gate electrodes and polysilicon emitter contacts whereby a recess is produced at the surface adjacent to the emitter contact, and (s) forming the respective p type and n type reach-through, extrinsic base, and source and drain using photoresist masks and implanting the respective dopant in the predetermined regions.

2. A process according to claim 1 wherein said oxide/nitride/oxide layer are, respectively, approximately 250 Å, 1000 Å, and 5000 Å thick.

3. A process according to claim 2 wherein said guard ring has a dopant concentration of $10^{-12} - 10^{-}$ cm$^{-2}$.

4. A process according to claim 3 wherein the field is oxidized to a thickness of approximately 5000 Å–6000 Å and the gate oxide is 100 Å–150 Å thick.

5. A process according to claim 4 wherein the blanket deposit of LPCVD polysilicon is 5000 Å–600 Å thick.

6. A process according to claim 5 wherein the polysilicon is selectively etched by reactive ion etching.

7. A process according to claim 6 wherein the polysilicon masking resist is etched backed either by a resist strip tool or directional RIE tool.

8. A process according to claim 7 wherein the gate oxide is removed by dilute hydrofluoric acid.

9. A process according to claim 8 wherein the second, thicker polysilicon deposition is 1500 Å–3000 Å thick.

10. A process according to claim 9 wherein onto the second layer of polysilicon is located a layer of a silicide followed by a layer of CVD oxide.

11. A process according to claim 10 wherein the silicide is tungsten silicide.

12. A process according to claim 10 wherein the silicide is titanium silicide.

13. A process according to claim 10 wherein the gate electrode stacks and emitter electrode stacks are patterned by selective removal of the polysilicon.

14. A process according to claim 13 wherein the selective removal of the polysilicon is by reactive ion etching.

15. A process according to claim 14 wherein an oxide spacer layer is formed at the edges of the emitter contact and gate contact.

16. A process according to claim 15 wherein the oxide layer is 300 Å–1000 Å thick.

17. A process according to claim 16 wherein two ion implants are made to form the P+ source/drain and extrinsic base of the PNP/PFET and the n+ source/drain and extrinsic base of the nFET/NPN.

18. A process according to claim 16 wherein a second oxide spacer layer is formed at the edges of the emitter contact and gate contact which can then be followed by ion implants to form the source/drain and base regions.

19. A process according to claim 1 wherein the P+ subcollector is isolated from the substrate by an oxide.

20. A process according to claim 19 wherein the oxide is formed by ion implantng oxygen.

21. A process according to claim 1 wherein the P+ subcollector is isolated from the substrate by use of an N type epitaxial layer.

* * * * *

UNITED STATES PATENT AND TRADEMARK OFFICE
CERTIFICATE OF CORRECTION

PATENT NO. : 4,868,135
DATED : September 19, 1989
INVENTOR(S) : Seiki Ogura, et al.

It is certified that error appears in the above-identified patent and that said Letters Patent is hereby corrected as shown below:

Column 4, line 2, change "$120^{13}$" to read --$10^{13}$--.

Column 4, line 13, change "$10^-$" to read --$10^{13}$--.

Column 4, line 15, change "Pepi" to read --P- epi--.

Column 5, line 56, change "WSi2" to read --$WSi_2$--.

Column 7, line 34, change "$10^{-12}$-$10^-$" to read --$10^{12}$-$10^{13}$--.

Signed and Sealed this

Twenty-eighth Day of August, 1990

Attest:

HARRY F. MANBECK, JR.

*Attesting Officer*  *Commissioner of Patents and Trademarks*